(12) United States Patent
Tekumalla et al.

(10) Patent No.: US 8,826,087 B2
(45) Date of Patent: Sep. 2, 2014

(54) SCAN CIRCUITRY FOR TESTING INPUT AND OUTPUT FUNCTIONAL PATHS OF AN INTEGRATED CIRCUIT

(71) Applicant: LSI Corporation, Milpitas, CA (US)

(72) Inventors: Ramesh C. Tekumalla, Breinigsville, PA (US); Vijay Sharma, Pune (IN)

(73) Assignee: LSI Corporation, San Jose, CA (US)

( * ) Notice: Subject to any disclaimer, the term of this patent is extended or adjusted under 35 U.S.C. 154(b) by 62 days.

(21) Appl. No.: 13/683,424

(22) Filed: Nov. 21, 2012

(65) Prior Publication Data

US 2014/0143621 A1    May 22, 2014

(51) Int. Cl.
 *G01R 31/28* (2006.01)
(52) U.S. Cl.
 USPC .............................. 714/726; 714/729; 714/718
(58) Field of Classification Search
 CPC ................................................ G01R 31/318536
 USPC ........................... 714/726, 718, 729, 719, 727
 See application file for complete search history.

(56) References Cited

U.S. PATENT DOCUMENTS

| | | | |
|---|---|---|---|
| 5,202,625 A | 4/1993 | Farwell | |
| 5,347,520 A | 9/1994 | Simpson et al. | |
| 5,623,502 A * | 4/1997 | Wang | 714/726 |
| 6,020,760 A | 2/2000 | Sample et al. | |
| 6,163,867 A | 12/2000 | Miller et al. | |
| 6,356,107 B1 | 3/2002 | Tang et al. | |
| 6,536,008 B1 * | 3/2003 | Nadeau-Dostie et al. | 714/726 |
| 7,380,183 B2 * | 5/2008 | Machimura | 714/726 |
| 7,823,034 B2 * | 10/2010 | Wohl et al. | 714/726 |
| 7,831,876 B2 | 11/2010 | Goyal et al. | |
| 8,645,778 B2 * | 2/2014 | Tekumalla et al. | 714/726 |

OTHER PUBLICATIONS

S. Sheibani, "High-Speed I/O Tests in High-Volume Manufacturing," Proceeds of the International Test Conference, 2006, 2 pages.
P. Iyer et al., "Testing High Speed IO Links Using On-Die Circuitry," Proceedings of the International Conference on VLSI Design, Jan. 2006.
U.S. Appl. No. 13/280,797 filed in the name of R.C. Tekumalla et al. on Oct. 25, 2011 and entitled "Dynamic Clock Domain Bypass for Scan Chains."

* cited by examiner

*Primary Examiner* — Fritz Alphonse
(74) *Attorney, Agent, or Firm* — Ryan, Mason & Lewis, LLP (57) ABSTRACT

An integrated circuit comprises scan test circuitry, additional circuitry subject to testing utilizing the scan test circuitry, and control circuitry associated with the scan test circuitry. The scan test circuitry comprises a scan chain having a plurality of scan cells, and the associated control circuitry is coupled to at least a given one of a primary input of the integrated circuit and a primary output of the integrated circuit. The scan test circuitry is configurable by the control circuitry so as to permit testing of both an input functional path associated with the given one of the primary input and the primary output and an output functional path associated with the given one of the primary input and the primary output.

25 Claims, 5 Drawing Sheets

SCAN CIRCUITRY FOR TESTING INPUT AND OUTPUT FUNCTIONAL PATHS OF AN INTEGRATED CIRCUIT

BACKGROUND

Integrated circuits are often designed to incorporate scan test circuitry that facilitates testing for various internal fault conditions. Such scan test circuitry typically comprises scan chains comprising multiple scan cells. The scan cells may be implemented, by way of example, utilizing respective flip-flops. The scan cells of a given scan chain are configurable to form a serial shift register for applying test patterns at inputs to combinational logic of the integrated circuit. The scan cells of the given scan chain are also used to capture outputs from other combinational logic of the integrated circuit.

Scan testing of an integrated circuit may therefore be viewed as being performed in two repeating phases, namely, a scan shift phase in which the flip-flops of the scan chain are configured as a serial shift register for shifting in and shifting out of test patterns, and a scan capture phase in which the flip-flops of the scan chain capture combinational logic outputs. These two repeating scan test phases may be collectively referred to herein as a scan test mode of operation of the integrated circuit, or as simply a scan mode of operation. Outside of the scan test mode and its scan shift and scan capture phases, the integrated circuit may be said to be in a functional mode of operation. Other definitions of the scan test and functional operating modes may also be used.

When an integrated circuit is placed in its scan mode of operation, signals are applied to primary inputs of the integrated circuit and outputs are observed at primary outputs of the integrated circuit. These primary inputs and primary outputs may be associated with respective signal pads that are bidirectional in the functional mode of operation. However, these signal pads lose their ability to operate in a bidirectional manner when the integrated circuit is configured in the scan mode of operation, because proper operation of the scan mode requires the corresponding primary inputs and primary outputs to be unidirectional. This is problematic in that certain input and output functional paths of the integrated circuit will remain untested during the scan mode of operation. For example, an input functional path associated with a primary output may remain untested, and an output functional path associated with a primary input may remain untested.

SUMMARY

In one embodiment, an integrated circuit comprises scan test circuitry, additional circuitry subject to testing utilizing the scan test circuitry, and control circuitry at least partially incorporated within or otherwise associated with the scan test circuitry. The scan test circuitry comprises a scan chain having a plurality of scan cells. The control circuitry associated with the scan test circuitry is coupled to at least a given one of a primary input of the integrated circuit and a primary output of the integrated circuit. The scan test circuitry is configurable by the control circuitry so as to permit testing of both an input functional path associated with the given one of the primary input and the primary output and an output functional path associated with the given one of the primary input and the primary output.

Other embodiments of the invention include, by way of example and without limitation, methods, testing systems, processing systems, processing devices and computer-readable storage media having computer program code embodied therein.

DETAILED DESCRIPTION

Embodiments of the invention will be illustrated herein in conjunction with exemplary systems, devices and corresponding integrated circuits comprising scan test circuitry for supporting scan testing of functional paths associated with primary inputs and primary outputs of the integrated circuits. By way of example, one or more such embodiments provide integrated circuits having scan test circuitry that is configurable by associated control circuitry to permit scan testing of at least one of a plurality of input and output functional paths associated with respective primary inputs and primary outputs of the integrated circuits. Accordingly, in a given embodiment, at least one input functional path associated with a scan testing primary output and at least one output functional path associated with a scan testing primary input can also be scan tested in an effective manner.

It should be understood, however, that embodiments of the invention are more generally applicable to any testing system or associated integrated circuit in which it is desirable to provide improved test coverage for at least one of input and output functional paths of an integrated circuit during scan testing.

Figure 1:
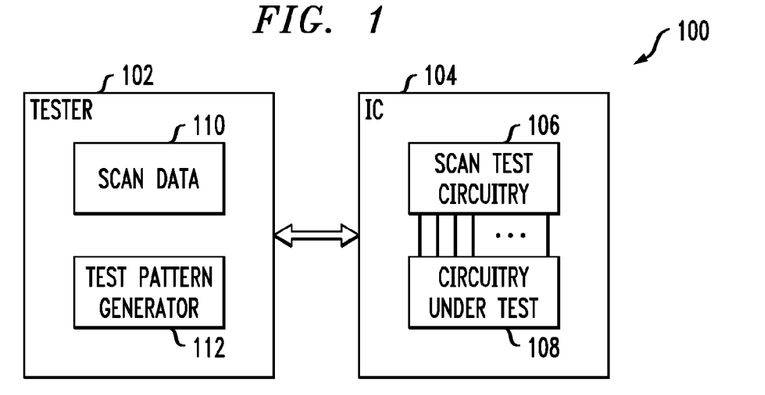
FIG. 1 is a block diagram showing an integrated circuit testing system comprising a tester and an integrated circuit under test in one embodiment.

FIG. 1 shows an embodiment of the invention in which a testing system 100 comprises a tester 102 and an integrated circuit under test 104. The integrated circuit 104 comprises scan test circuitry 106 coupled to additional internal circuitry 108 that is subject to testing utilizing the scan test circuitry 106. The tester 102 stores scan data 110 associated with scan testing of the integrated circuit. Such scan data may correspond to test patterns provided by a test pattern generator 112. In other embodiments, at least a portion of the tester 102, such as the test pattern generator 112, may be incorporated into the integrated circuit 104. Alternatively, the entire tester 102 may be incorporated into the integrated circuit 104, as in a built-in self-test (BIST) arrangement.

The test pattern generator 112 may be implemented as an automatic test pattern generator (ATPG), and may be viewed as an example of what is more generally referred to herein as a test generation tool.

The particular configuration of testing system 100 as shown in FIG. 1 is exemplary only, and the testing system 100 in other embodiments may include other elements in addition to or in place of those specifically shown, including one or more elements of a type commonly found in a conventional implementation of such a system. For example, various elements of the tester 102 or other parts of the system 100 may be implemented, by way of illustration only and without limitation, utilizing a microprocessor, central processing unit (CPU), digital signal processor (DSP), application-specific integrated circuit (ASIC), field-programmable gate array (FPGA), or other type of data processing device, as well as portions or combinations of these and other devices.

The integrated circuit 104 may be configured for installation on a circuit board or other mounting structure in a computer, server, mobile telephone or other type of communication device. Such communication devices may also be viewed as examples of what are more generally referred to herein as "processing devices." The latter term is also intended to encompass storage devices, as well as other types of devices comprising data processing circuitry.

Embodiments of the present invention may be configured to utilize compressed or noncompressed scan testing, and embodiments of the invention are not limited in this regard. Additional details regarding the operation of exemplary scan compression elements such as a decompressor and a compressor that may be incorporated into integrated circuit 104 in one or more embodiments can be found in U.S. Pat. No. 7,831,876, entitled "Testing a Circuit with Compressed Scan Subsets," which is commonly assigned herewith and incorporated by reference herein.

Figure 2:
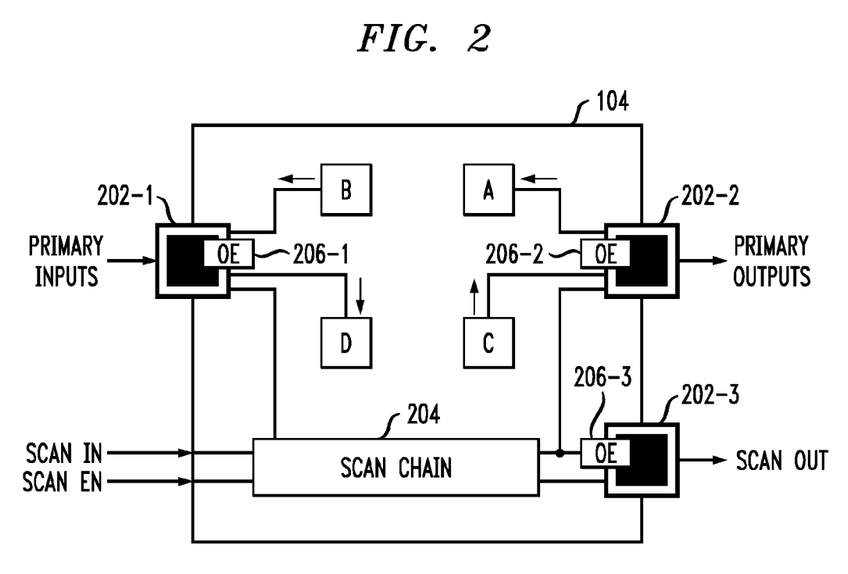
FIG. 2 shows a more detailed view of portions of an embodiment of the integrated circuit in the testing system of FIG. 1.

Referring now to FIG. 2, portions of one embodiment of the integrated circuit 104 are shown in greater detail. In this embodiment, the integrated circuit comprises input-output circuitry 202-1 associated with primary inputs, input-output circuitry 202-2 associated with primary outputs, and input-output circuitry 202-3 associated with a scan output. The primary inputs and primary outputs of the integrated circuit 104 are assumed to comprise respective inputs and outputs defined as primary for purposes of scan testing, although other types of primary inputs and outputs may be used. The integrated circuit 104 further comprises a scan chain 204 coupled between a scan input and the scan output. The scan chain 204 comprises a plurality of scan cells.

Although only a single scan chain is shown in this figure, the integrated circuit 204 will typically include multiple scan chains, each comprising a plurality of scan cells. Each such scan chain can have the same number of scan cells, or different scan chains may include different numbers of scan cells. For example, the lengths of at least a subset of the scan chains within the integrated circuit may be balanced so that the same amount of time is needed to shift a desired set of scan test patterns into those scan chains.

The scan chain 204 also receives a scan enable (SE) signal which causes the scan cells of the scan chain 204 to form a serial shift register during scan testing. More particularly, the scan cells of the scan chain 204 in this embodiment form the serial shift register responsive to the SE signal being at a first designated logic level (e.g., a logic "1" level) and the scan cells capture functional data when the SE signal is at a second designated logic level (e.g., a logic "0" level). A single SE signal may be used to control all of the scan chains of the integrated circuit 104, or only a subset of those scan chains, with the remaining scan chains being controlled using one or more other SE signals. The SE signal in the present embodiment basically controls configuration of scan cells of a scan chain to form a serial shift register for shifting in and shifting out of test patterns. The SE signal may therefore be considered a type of scan shift enable signal, or more generally, a type of scan shift control signal.

When the scan chain 204 is configured to form a serial shift register for shifting in and shifting out scan test data associated with one or more test patterns to be applied by the tester 102, the scan test circuitry may be said to be in a scan shift phase of a scan test mode of operation. It should be appreciated, however, that a wide variety of other types of scan shift control signals and sets of integrated circuit operating modes and phases may be used in other embodiments. These embodiments therefore do not require the use of any particular definition of operating modes and phases.

The scan chain 204 may be associated with multiple distinct clock domains, or a single clock domain. It will be assumed in some embodiments that the scan chain 204 is a multiple clock domain scan chain, that is, a scan chain comprising sub-chains associated with respective distinct clock domains. Such sub-chains of a multiple clock domain scan chain may be separated from one another by lockup latches. Also, one or more of the sub-chains may be selectively bypassed using clock domain bypass circuitry so as to not be part of the serial shift register formed by the scan chain in the scan shift phase. For example, such clock domain bypass circuitry may be configured to bypass one or more of the sub-chains that are determined to be inactive for a particular test pattern, and the clock domain bypass circuitry may bypass different ones of the sub-chains for different test patterns. Additional details regarding clock domain bypass circuitry that may be utilized in embodiments of the invention may be found in U.S. patent application Ser. No. 13/280,797, filed Oct. 25, 2011 and entitled "Dynamic Clock Domain Bypass for Scan Chains," which is commonly assigned herewith and incorporated by reference herein.

The circuitry under test 108 in this embodiment comprises a plurality of combinational logic blocks, of which exemplary blocks denoted A, B, C and D are shown. The combinational logic blocks are illustratively coupled to primary inputs or primary outputs of the integrated circuit 104.

Combinational logic blocks such as A, B, C and D may be viewed as examples of what are more generally referred to herein as "additional circuitry" that is subject to testing utilizing scan test circuitry in embodiments of the invention. By way of example, such internal circuitry blocks of integrated circuit 104 may represent portions of different integrated circuit cores, such as respective read channel and additional cores of a system-on-chip (SOC) integrated circuit in a hard disk drive (HDD) controller application, designed for reading and writing data from one or more magnetic storage disks of an HDD. In other embodiments, the circuit blocks subject to testing by the scan chains may comprise other types of functional logic circuitry, in any combination, and the term "additional circuitry" is intended to be broadly construed so as to cover any such arrangements of logic circuitry.

Scan test input data is shifted into the scan chain 204 from the tester 102 and applied to one or more of the combinational logic blocks A, B, C and D. Scan test output data captured from one of more of the combinational logic blocks A, B, C and D is shifted out of the scan chain 204 for delivery back to the tester 102.

The scan chain 204 may be viewed as corresponding to as a "scan channel" of the integrated circuit 104. As indicated previously, the integrated circuit will generally include a large number of such scan channels, each associated with a corresponding one of a plurality of scan chains.

A given test pattern applied to the scan chain 204 in the present embodiment may be viewed as a scan vector, where a scan vector comprises a shift-in phase in which scan test input data is shifted into the scan chain 204, followed by a capture phase in which functional data is captured, followed by a shift-out phase in which scan test output data is shifted out from the scan chain 204. The scan vectors for different test patterns may overlap with one another, in that as input data is shifted in for a given test pattern, captured data for a previous pattern may be shifted out. The shift-in and shift-out phases may be individually or collectively referred to herein as one or more scan shift phases of the scan vector or associated test pattern. As noted above, such scan shift phases may be viewed as being part of a scan test mode of operation of the integrated circuit 104.

In the FIG. 2 embodiment, integrated circuit 104 in the scan mode of operation is configured to test input functional paths associated with the primary inputs, and output functional paths associated with the primary outputs. Moreover, integrated circuit 104 in the scan mode of operation is further configured to test output functional paths associated with the primary inputs and input functional paths associated with the primary outputs. The figure illustrates an input functional path to block A that passes through input-output circuitry 202-2 associated with the primary outputs, and an output functional path from block B that passes through the input-output circuitry 202-1 associated with the primary inputs. Also shown is an output functional path from block C that passes through input-output circuitry 202-2 associated with the primary outputs, and an input functional path to block D that passes through input-output circuitry 202-1 associated with the primary inputs.

The input-output circuitry 202-1, 202-2 and 202-3 as illustrated comprises respective output enable (OE) circuitry 206-1, 206-2 and 206-3. Each instance of the OE circuitry 206 comprises one or more OE control signal lines that are used to configure a corresponding bidirectional signal pad of the associated instance of the input-output circuitry 202. Thus, for example, in normal scan testing of the integrated circuit 104 using primary inputs and primary outputs, the OE circuitry 206-1 configures its associated bidirectional signal pads as inputs, and the OE circuitry 206-2 configures its associated bidirectional signal pads as outputs. As mentioned previously, this normal scan testing does not test certain input and output functional paths, such as an input functional path for a bidirectional signal pad configured as a primary output, and an output functional path for a bidirectional signal pad configured as a primary input. However, the scan test circuitry of the integrated circuit 104 in the present embodiment is able to test these and other input and output functional paths that would not otherwise be tested using conventional techniques.

The input-output circuitry 202 and the corresponding OE circuitry 206 may be viewed as collectively comprising at least a portion of what is more generally referred to herein as "control circuitry" associated with the scan test circuitry 106 of the integrated circuit 104. A number of possible embodiments of such control circuitry will be described in greater detail below in conjunction with FIGS. 3, 5 and 7. The control circuitry may be viewed in some embodiments as being part of the scan test circuitry 106. Thus, control circuitry described herein as being associated with scan test circuitry may be at least partially incorporated within the scan test circuitry. The control circuitry in one or more embodiments is coupled to at least a given one of a primary input and a primary output of the integrated circuit 104. For example, the control circuitry may be coupled between a plurality of primary inputs and a plurality of primary outputs.

The scan test circuitry 106 is configurable by the control circuitry so as to permit testing of both an input functional path associated with the given one of the primary input and the primary output and an output functional path associated with the given one of the primary input and the primary output.

For example, if the given one of the primary input and the primary output is the primary input, the scan test circuitry 106 is configurable by the control circuitry in a first state in which the input functional path associated with the primary input is tested and in a second state in which the output functional path associated with the primary input is tested. The scan test circuitry 106 in this example may be configured in the second state in part of a capture phase of a scan mode of operation of the integrated circuit 104, but may otherwise be in the first state in the scan mode of operation.

As another example, if the given one of the primary input and the primary output is the primary output, the scan test circuitry 106 is configurable by the control circuitry in a first state in which the output functional path associated with the primary output is tested and in a second state in which the input functional path associated with the primary output is tested. Again, the scan test circuitry 106 may be configured in the second state in part of a capture phase of a scan mode of operation of the integrated circuit 104, but may otherwise be in the first state in the scan mode of operation.

Figure 3:
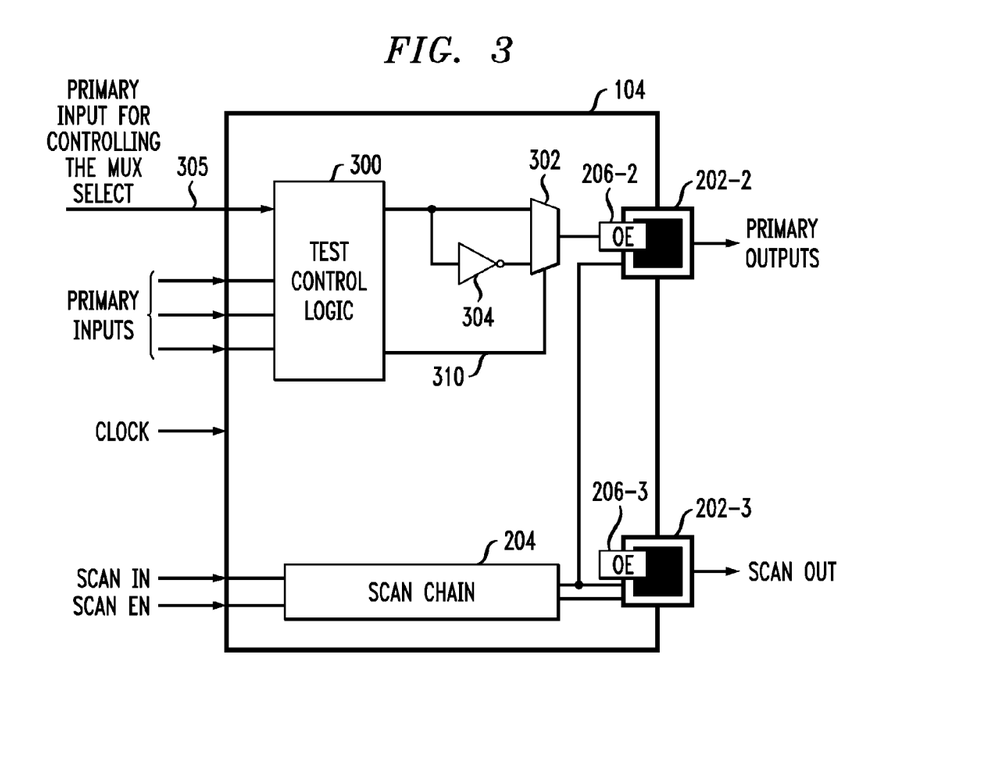
FIG. 3 illustrates one embodiment of scan test circuitry and associated control circuitry of the FIG. 2 integrated circuit for testing an input functional path associated with a primary output.

FIG. 3 shows an embodiment of the integrated circuit 104 in which scan test circuitry and associated control circuitry are utilized to test an input functional path associated with a primary output. In this embodiment, the control circuitry further comprises test control logic 300 and multiplexing circuitry illustratively implemented as a two-to-one multiplexer 302 having an associated input inverter 304. These exemplary control circuitry elements are in addition to the previously-described input-output circuitry 202 and OE circuitry 206 of the FIG. 2 embodiment, although only input-output circuitry 202-2 and 202-3 and OE circuitry 206-2 and 206-3 are explicitly shown in FIG. 3.

The test control logic 300 has a plurality of inputs coupled to respective primary inputs of the integrated circuit 104 and an additional primary input 305 adapted to receive a control signal for controlling the multiplexer 302.

The multiplexer 302 has a first input adapted to receive an output enable signal from the test control logic 300, a second input adapted to receive a complemented version of the output enable signal via inverter 304, and a select signal input adapted to receive a select signal via signal line 310 from the test control logic 300.

As indicated above, the multiplexer 302 and its associated inverter 304 may be viewed as an example of what is more generally referred to herein as "multiplexing circuitry." Such multiplexing circuitry in the present embodiment controls the OE circuitry 206-2 between two different states, one used for normal scan testing in which an output functional path is established for at least a given one of the primary outputs, and another in which an input functional path is established for the given one of the primary outputs. Accordingly, the corresponding bidirectional signal pad of the input-output circuitry 202-2 is part of the output functional path in the state associated with normal scan testing, and is part of the input functional path in the other state.

The test control logic 300 via the control signal applied to additional primary input 305 controls the multiplexer 302 so as to apply either the normal scan testing output enable signal or its complement to the OE circuitry 206-2. In the present embodiment, the complement of the normal scan testing output enable signal is applied to the OE circuitry 206-2 to establish the input functional path during part of a capture phase of the scan mode of operation, when the SE signal is at a logic low level. More particularly, a logic high control signal applied to the additional primary input 305 during the capture phase causes the multiplexer 302 to select the complement of the normal scan testing output enable signal for application to the OE circuitry 206-2.

For normal scan testing, in which an output functional path is established for the given primary output, a logic low control signal applied to the additional primary input 305 causes the multiplexer 302 to select the normal scan testing output enable signal for application to the OE circuitry 206-2. The additional primary input 305 in the present embodiment therefore allows the tester 102 to select between normal scan testing that uses an output functional path associated with the given primary output, and modified scan testing that uses an input functional path associated with the given primary output during part of a capture phase of the scan mode of operation.

Figure 4:
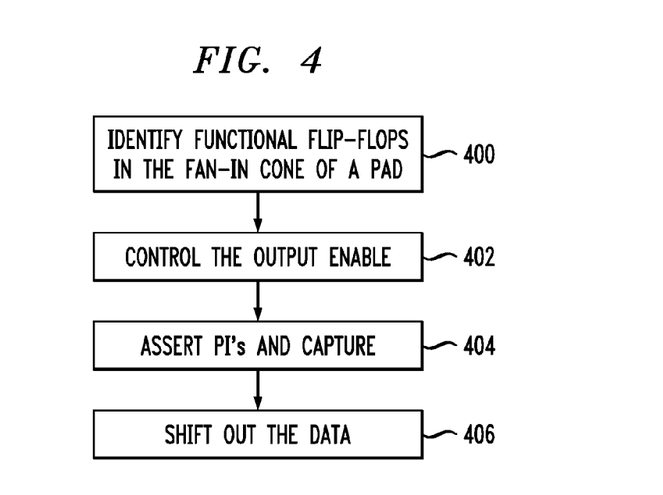
FIG. 4 is a flow diagram showing one embodiment of a testing process implemented using the scan test circuitry and associated control circuitry of FIG. 3.

FIG. 4 illustrates a modified scan testing process for testing an input functional path associated with a primary output, using the scan test circuitry and associated control circuitry of FIG. 3. The process as shown includes steps 400 through 406, portions of which may be carried out under control of the tester 102.

In step 400, functional flip-flops in a fan-in cone of the bidirectional signal pad of the primary output are identified. This portion of the process may be performed in conjunction with analysis of the integrated circuit design, possibly in a processing system of the type shown in FIG. 9.

In step 402, the output enable signal applied to the OE circuitry 206-2 is controlled in the manner described previously. Thus, as indicated above, the complement of the normal scan testing output enable signal is applied to the OE circuitry 206-2 by multiplexing circuitry to establish the input functional path during part of a capture phase of the scan mode of operation, when the SE signal is at a logic low level.

In step 404, the primary inputs are asserted to respective designated values and the functional flip-flops identified in step 400 are captured by applying appropriate clock signals to these flip-flops. The primary inputs in this step are assumed to include the primary output, which in step 402 was reconfigured via OE circuitry 206-2 to operate in effect as a primary input for purposes of the modified scan testing.

In step 406, the data captured from the functional flip-flops in step 404 is shifted out via the scan chain 204 in a shift phase of the scan mode of operation. At this point in the process, the primary output has been reconfigured back to support a functional output path as in normal scan testing.

The FIG. 4 process allows the input functional path associated with the primary output to be tested using the scan test circuitry 106. Any faults associated with this path are detectable in the data shifted out of the scan chain 204.

It is to be appreciated that the particular process steps of FIG. 4 are exemplary only, and other embodiments may use different types and arrangements of process steps. For example, although step 402 controls the OE circuitry 206-2 during part of a capture phase of the scan mode of operation, the OE circuitry may be controlled in a similar manner during other operating modes and phases.

Figure 5:
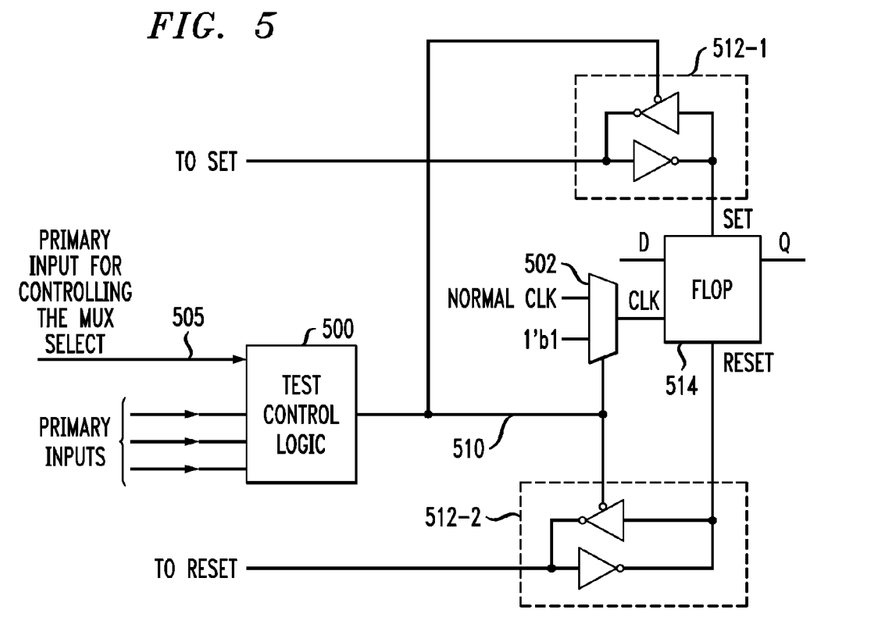
FIG. 5 illustrates one embodiment of scan test circuitry and associated control circuitry of the FIG. 2 integrated circuit for testing an output functional path associated with a primary input.

FIG. 5 shows an embodiment of the integrated circuit 104 in which scan test circuitry and associated control circuitry are utilized to test an output functional path associated with a primary input. In this embodiment, the control circuitry further comprises test control logic 500 and multiplexing circuitry illustratively implemented as a two-to-one multiplexer 502. These exemplary control circuitry elements are in addition to the previously-described input-output circuitry 202 and OE circuitry 206 of the FIG. 2 embodiment, although the input-output circuitry 202 and OE circuitry 206 are not explicitly shown in FIG. 5.

Moreover, the FIG. 5 embodiment is assumed to include additional control circuitry elements that are also not explicitly shown in the figure, such as additional test control logic and additional multiplexing circuitry for controlling at least the primary input OE circuitry 206-1, in a manner similar to that previously described for the primary output OE circuitry 206-2 in the context of the FIG. 3 embodiment.

The test control logic 500 has a plurality of inputs coupled to respective primary inputs of the integrated circuit 104 and an additional primary input 505 adapted to receive a control signal for controlling the multiplexer 502. The control circuitry comprising test control logic 500 and multiplexer 502 are illustratively configured to interrupt a clock signal applied to one or more flip-flops of the circuitry under test 108 when testing the output functional path associated with the primary input.

The multiplexer 502 has a first input adapted to receive a normal clock signal, a second input adapted to receive a predetermined value, illustratively a logic high value in the present embodiment, and a select signal input adapted to receive a select signal via signal line 510 from the test control logic 500.

The control circuitry in the present embodiment further comprises first and second latch circuits 512-1 and 512-2, which are associated with respective set and reset signal lines of a functional flip-flop 514, where in this embodiment a functional flip-flop denotes a flip-flop that is part of the output functional path associated with the primary input. The first and second latch circuits 512-1 and 512-2 are configured to hold the respective set and reset inputs of the flip-flop 514 at particular designated values when testing the output functional path associated with the primary input.

The first latch circuit 512-1 is arranged in the set signal line of the flip-flop 514, between a set signal source and the set input of the flip-flop. Similarly, the second latch circuit 512-2 is arranged in the reset signal line of the flip-flop 514, between a reset signal source and the reset input of the flip-flop. Each of the latch circuits 512 comprises a first inverter arranged in series with the set or reset signal line and a second inverter coupled back-to-back and in parallel with the first inverter, with the second inverter being a tri-state inverter having a control input adapted to receive a control signal, which in this embodiment is the same select signal that is applied to the multiplexer 502 via signal line 510.

In order to hold the set and reset inputs steady, the tri-state inverters in the latch circuits 512 are enabled by assertion of the select signal so as to establish feedback paths through those inverters back to the inputs of the corresponding first inverters. Subsequent deassertion of the select signal will switch off the tri-state inverters thereby once again allowing the flip-flop 514 to set and reset responsive to set and reset signals.

As indicated above, the multiplexer 502 may be viewed as an example of what is more generally referred to herein as "multiplexing circuitry." Such multiplexing circuitry in the present embodiment is configured to interrupt the normal clock signal by selecting between the normal clock signal and the predetermined value for application to clock inputs of the flip-flop 514 and one or more additional flip-flops of the circuitry under test 108 responsive to the select signal provided by the test control logic 500 via signal line 510. Each of the flip-flops for which the same clock signal is interrupted may share a corresponding instance of multiplexer 502. Also, multiple flip-flops may share the set and reset latch circuits 512-1 and 512-2, although only the single flip-flop 514 is shown in FIG. 5.

The OE circuitry 206-1 associated with at least one primary input for which both input and output functional paths are to be tested is controlled between two different states, one used for normal scan testing in which an input functional path is established for at least a given one of the primary inputs, and another in which an output functional path is established for the given one of the primary inputs. Accordingly, the corresponding bidirectional signal pad of the input-output circuitry 202-1 is part of the input functional path in the state associated with normal scan testing, and is part of the output functional path in the other state.

The test control logic 500 via the control signal applied to additional primary input 505 controls multiplexing circuitry not explicitly shown in FIG. 5 so as to apply either the normal scan testing output enable signal or its complement to the OE circuitry 206-1. In the present embodiment, the complement of the normal scan testing output enable signal is applied to the OE circuitry 206-1 to establish the output functional path during part of a capture phase of the scan mode of operation, when the SE signal is at a logic low level. More particularly, a logic high control signal applied to the additional primary input 505 during the capture phase causes the multiplexing circuitry to select the complement of the normal scan testing output enable signal for application to the OE circuitry 206-1.

For normal scan testing, in which an input functional path is established for the given primary input, a logic low control signal applied to the additional primary input 505 causes the multiplexing circuitry not explicitly shown in FIG. 5 to select the normal scan testing output enable signal for application to the OE circuitry 206-1. The additional primary input 505 in the present embodiment therefore allows the tester 102 to select between normal scan testing that uses an input functional path associated with the given primary input, and modified scan testing that uses an output functional path associated with the given primary input during part of a capture phase of the scan mode of operation.

Moreover, the logic low control signal applied to the additional primary input 505 causes the multiplexer 502 to select the normal clock signal for application to the clock input of the flip-flop 514 and other similar functional flip-flops. It also causes the latch circuits 512-1 and 512-2 to hold the respective set and reset inputs of the flip-flop 514 and other similar functional flip-flops at particular designated values when testing the output functional path associated with the primary input.

Figure 6:
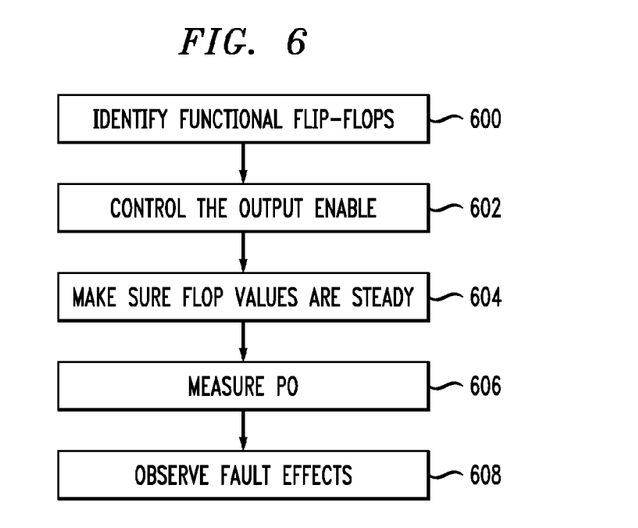
FIG. 6 is a flow diagram of one embodiment of a testing process implemented using the scan test circuitry and associated control circuitry of FIG. 5.

FIG. 6 illustrates a modified scan testing process for testing an output functional path associated with a primary input, using the scan test circuitry and associated control circuitry of FIG. 5. The process as shown includes steps 600 through 608, portions of which may be carried out under control of the tester 102.

In step 600, functional flip-flops in a fan-in cone of the bidirectional signal pad of the primary input are identified. This portion of the process may be performed in conjunction with analysis of the integrated circuit design, possibly in a processing system of the type shown in FIG. 9.

In step 602, the output enable signal applied to the OE circuitry 206-1 is controlled in the manner described previously. Thus, as indicated above, the complement of the normal scan testing output enable signal is applied to the OE circuitry 206-1 by multiplexing circuitry to establish the output functional path during part of a capture phase of the scan mode of operation, when the SE signal is at a logic low level.

In step 604, the signals applied to the respective clock, set and reset inputs of each of the functional flop-flops identified in step 600 are held steady using control circuitry comprising multiplexer 502 and latch circuits 512 as previously described. This ensures that the data values stored in the respective functional flip-flops are not disturbed and therefore remain steady when one or more primary outputs driven by those flip-flops are measured.

In step 606, the above-noted primary outputs are measured. The primary outputs in this step are assumed to include the primary input, which in step 602 was reconfigured via OE circuitry 206-1 to operate in effect as a primary output for purposes of the modified scan testing.

In step 608, any fault effects apparent in the measured primary outputs are observed. The primary input can then be reconfigured back to support a functional input path as in normal scan testing.

The FIG. 6 process allows the output functional path associated with the primary input to be tested using the scan test circuitry 106. Any faults associated with this path are detectable by measurement of primary outputs.

Again, it is to be appreciated that the particular process steps of FIG. 6 are exemplary only, and other embodiments may use different types and arrangements of process steps. For example, although step 602 controls the OE circuitry 206-1 during part of a capture phase of the scan mode of operation, the OE circuitry may be controlled in a similar manner during other operating modes and phases.

As indicated previously herein, the scan circuitry 106 is also utilized for testing output functional paths associated with primary outputs, and input functional paths associated with primary inputs.

Figure 7:
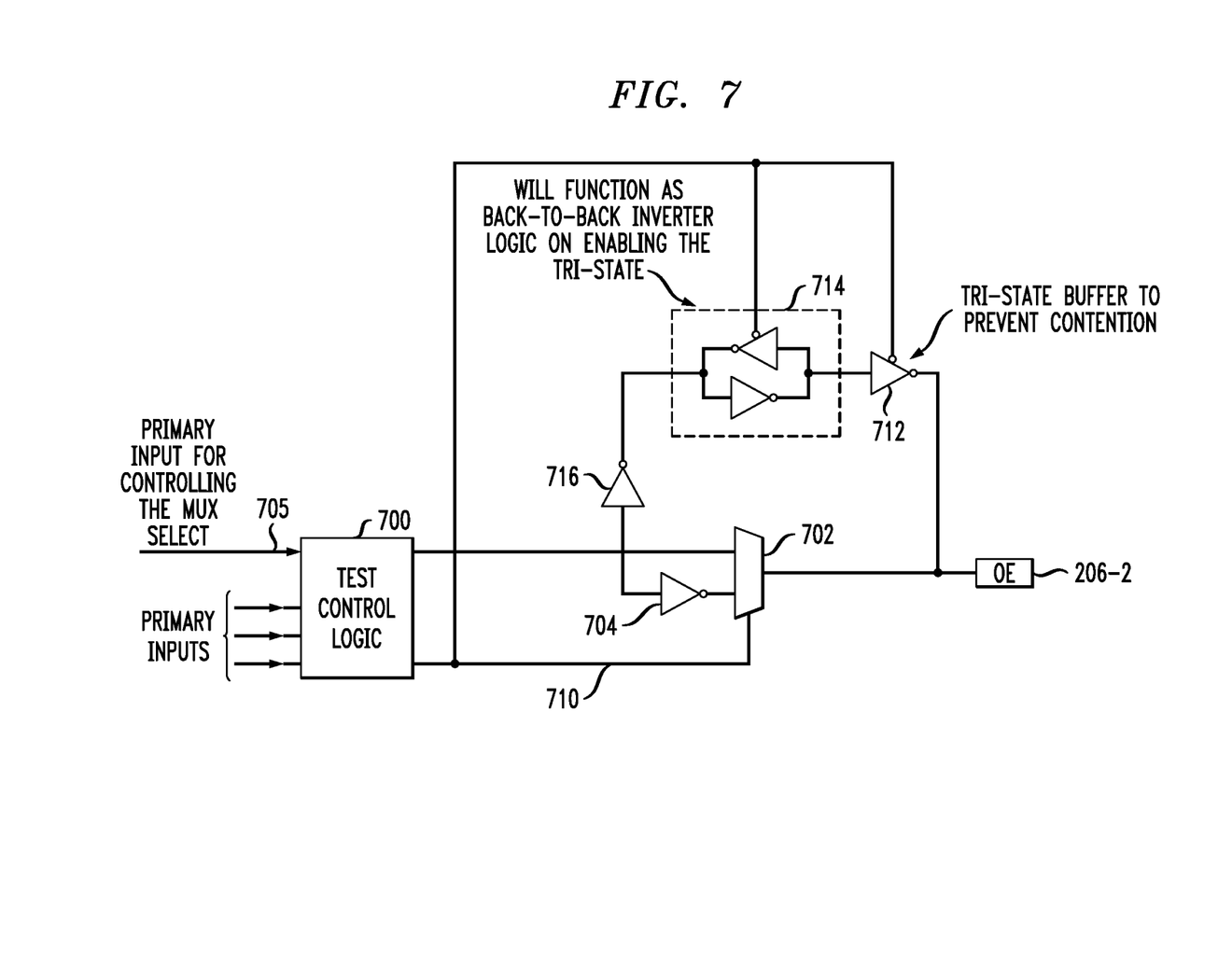
FIG. 7 illustrates one embodiment of scan test circuitry and associated control circuitry of the FIG. 2 integrated circuit for testing an output functional path associated with a primary output.

FIG. 7 shows an embodiment of the integrated circuit 104 in which scan test circuitry and associated control circuitry are utilized to test an output functional path associated with a primary output. In this embodiment, the control circuitry further comprises test control logic 700 and multiplexing circuitry illustratively implemented as a two-to-one multiplexer 702 having an associated input inverter 704. These exemplary control circuitry elements are in addition to the previously-described input-output circuitry 202 and OE circuitry 206 of the FIG. 2 embodiment, although only OE circuitry 206-2 is explicitly shown in FIG. 7.

The test control logic 700 has a plurality of inputs coupled to respective primary inputs of the integrated circuit 104 and an additional primary input 705 adapted to receive a control signal for controlling the multiplexer 702.

The multiplexer 702 has a first input adapted to receive an output enable signal from the test control logic 700, a second input adapted to receive a complemented version of the output enable signal via inverter 704, and a select signal input adapted to receive a select signal via signal line 710 from the test control logic 700.

As indicated above, the multiplexer 702 and its associated inverter 704 may be viewed as an example of what is more generally referred to herein as "multiplexing circuitry." Such multiplexing circuitry in the present embodiment controls the OE circuitry 206-2 between two different states, one used for normal scan testing in which an output functional path is established for at least a given one of the primary outputs, and another in which an input functional path is established for the given one of the primary outputs. Accordingly, the corresponding bidirectional signal pad of the input-output circuitry 202-2 is part of the output functional path in the state associated with normal scan testing, and is part of the input functional path in the other state.

The test control logic 700 via the control signal applied to additional primary input 705 controls the multiplexer 702 so as to apply either the normal scan testing output enable signal or its complement to the OE circuitry 206-2. In the present embodiment, in which an output functional path is being tested, the normal scan testing output enable signal is applied to the OE circuitry 206-2 to establish the output functional path. More particularly, a logic low control signal applied to the additional primary input 705 causes the multiplexer 702 to select the normal scan testing output enable signal for application to the OE circuitry 206-2.

Moreover, the control circuitry in this embodiment is further configured to prevent contention on the primary output when testing the output functional path associated with the primary output, using a tri-state inverter 712, latch circuit 714 and inverter 716. These additional control circuitry elements serve to ensure that the output enable signal applied to the OE circuitry 206-2 is held steady such that the functional output path is maintained for the given primary output.

The latch circuit 714 is driven by the output of inverter 716, which receives as its input the normal output enable signal from the test control logic 700. The latch circuit 714 comprises a first inverter arranged in series between the output of the inverter 716 and the input of the tri-state inverter 712, and a second inverter coupled back-to-back and in parallel with the first inverter, with the second inverter being a tri-state inverter having a control input adapted to receive a control signal, which in this embodiment is the same select signal that is applied to the multiplexer 702 via signal line 710. The tri-state inverter 712 also has a control input that receives this same select signal. Accordingly, when the output functional path associated with the primary output is being tested, both of the tri-state inverters are disabled so as to ensure that there is no contention at the input of the OE circuitry 206-2.

It should be noted that no additional control circuitry is utilized in these embodiments to allow testing of an input functional path associated with a primary input. Normal scan testing can be used for this situation.

One or more of the above-described embodiments can provide improved fault coverage in scan testing of an integrated circuit by allowing effective testing of input functional paths associated with primary outputs and output functional paths associated with primary inputs.

It is to be appreciated that the particular circuitry arrangements shown in FIGS. 1-3, 5 and 7 and the particular process operations shown in FIGS. 4 and 6 are presented by way of illustrative example only, and numerous alternative arrangements of scan test circuitry and associated control circuitry or corresponding process operations may be used to implement the described functionality. This functionality can be implemented in one or more of the embodiments without any significant negative impact on integrated circuit area requirements or functional timing requirements.

As mentioned previously, the presence of control circuitry of the type described above within integrated circuit 104 may be made apparent to a test pattern generator or other test generation tool so that the tool can take the associated functionality into account in generating test patterns. In order to accomplish this, one or more input files describing the operation of this circuitry may be provided to the test generation tool.

Figure 8:
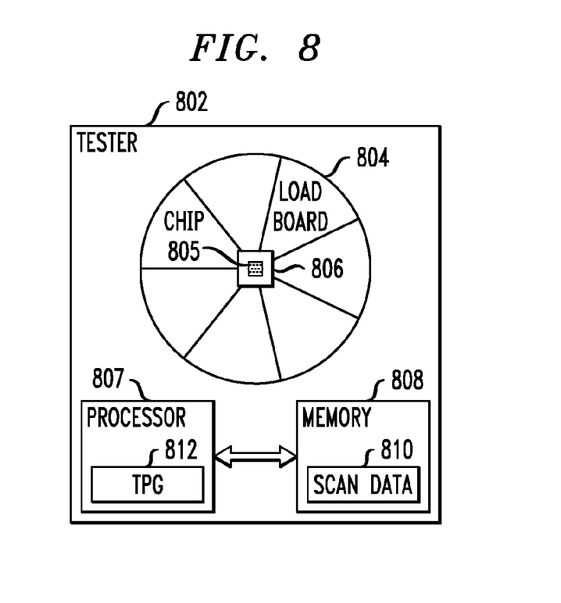
FIG. 8 shows one possible implementation of the testing system of FIG. 1.

The tester 102 in the testing system 100 of FIG. 1 need not take any particular form, and various conventional testing system arrangements can be modified in a straightforward manner to support the scan testing functionality disclosed herein. One possible example is shown in FIG. 8, in which a tester 802 comprises a load board 804 in which an integrated circuit 805 to be subject to scan testing using the techniques disclosed herein is installed in a central portion 806 of the load board 804. The tester 802 also comprises processor and memory elements 807 and 808 for executing stored program code. In the present embodiment, processor 807 is shown as implementing a test pattern generator 812, which may be implemented as an ATPG. Associated scan data 810 is stored in memory 808. Numerous alternative testers may be used to perform scan testing of an integrated circuit as disclosed herein. Also, as indicated previously, in alternative embodiments at least portions of the tester 802 may be incorporated into the integrated circuit itself, as in BIST arrangement.

Figure 9:
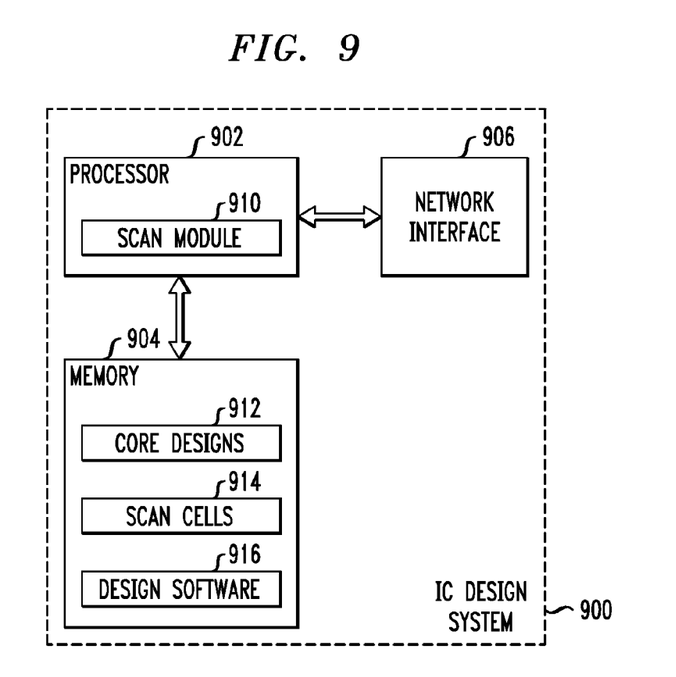
FIG. 9 is a block diagram of a processing system for generating an integrated circuit design comprising scan test circuitry and associated control circuitry of the type illustrated in FIGS. 3, 5 and 7.

The insertion of scan test circuitry and associated control circuitry of a given integrated circuit design may be performed in a processing system 900 of the type shown in FIG. 9. Such a processing system in this embodiment more particularly comprises a design system configured for use in designing integrated circuits such as integrated circuit 104 to include scan chains 204 and associated control circuitry.

The system 900 comprises a processor 902 coupled to a memory 904. Also coupled to the processor 902 is a network interface 906 for permitting the processing system to communicate with other systems and devices over one or more networks. The network interface 906 may therefore comprise one or more transceivers. The processor 902 implements a scan module 910 for supplementing core designs 912 with scan cells 914 and associated control circuitry elements in the manner disclosed herein, in conjunction with utilization of integrated circuit design software 916.

By way of example, the scan chain circuitry 106 comprising scan chain 204 and associated control circuitry may be generated in system 900 using a register-transfer level (RTL) description and then synthesized to gate level using a specified technology library. A test generation model may then be created for generating test patterns using a test generation tool. Control files or other types of input files may be used to provide the test generation tool with information such as the particular scan chain portions that are driven by clock signals of particular clock domains in a given embodiment. Once the corresponding rules are in place, a rule checker may be run so that the test generation tool has visibility of the scan chains taking into account the operation of the control circuitry. Test patterns may then be generated for the scan chain circuitry.

Elements such as 910, 912, 914 and 916 are implemented at least in part in the form of software stored in memory 904 and processed by processor 902. For example, the memory 904 may store program code that is executed by the processor 902 to implement particular scan testing functionality of module 910 within an overall integrated circuit design process.

The memory 904 is an example of what is more generally referred to herein as a computer-readable medium or other type of computer program product having computer program code embodied therein, and may comprise, for example, electronic memory such as RAM or ROM, magnetic memory, optical memory, or other types of storage devices in any combination. The processor 902 may comprise a microprocessor, CPU, ASIC, FPGA or other type of processing device, as well as portions or combinations of such devices. The memory 808 of FIG. 8 may be viewed as another illustrative example of a computer program product as the latter term is used herein.

As indicated above, embodiments of the invention may be implemented in the form of integrated circuits. In a given such integrated circuit implementation, identical die are typically formed in a repeated pattern on a surface of a semiconductor wafer. Each die includes scan test circuitry and associated control circuitry, and may include other structures or circuits. The individual die are cut or diced from the wafer, then packaged as an integrated circuit. One skilled in the art would know how to dice wafers and package die to produce integrated circuits. Integrated circuits so manufactured are considered embodiments of this invention.

It should again be emphasized that the embodiments of the invention as described herein are intended to be illustrative only. For example, other embodiments of the invention can be implemented using a wide variety of other types of scan test circuitry, with different types and arrangements of scan cells, as well as different types and arrangements of associated control circuitry and control signaling, than those included in the embodiments described herein. These and numerous other alternative embodiments within the scope of the following claims will be readily apparent to those skilled in the art.

What is claimed is:

1. An integrated circuit comprising:
   scan test circuitry comprising at least one scan chain having a plurality of scan cells;
   additional circuitry subject to testing utilizing the scan test circuitry; and
   control circuitry associated with the scan test circuitry and coupled to at least a given one of a primary input of the integrated circuit and a primary output of the integrated circuit;
   wherein the scan test circuitry is configurable by the control circuitry so as to permit testing of both an input functional path associated with the given one of the primary input and the primary output and an output functional path associated with the given one of the primary input and the primary output;
   wherein one of:
   (i) the given one of the primary input and the primary output is the primary input, wherein the scan test circuitry is configurable by the control circuitry in a first state in which the input functional path associated with the primary input is tested and in a second state in which the output functional path associated with the primary input is tested; and
   (ii) the given one of the primary input and the primary output is the primary output, wherein the scan test circuitry is configurable by the control circuitry in a first state in which the output functional path associated with the primary output is tested and in a second state in which the input functional path associated with the primary output is tested.

2. The integrated circuit of claim 1 wherein the given one of the primary input and the primary output is the primary input, and the scan test circuitry is configured in the second state, in which the output functional path associated with the primary input is tested, in part of a capture phase of a scan mode of operation of the integrated circuit but is otherwise in the first state, in which the input functional path associated with the primary input is tested, in the scan mode of operation.

3. The integrated circuit of claim 1 wherein the given one of the primary input and the primary output is the primary output, and the scan test circuitry is configured in the second state, in which the input functional path associated with the primary output is tested, in part of a capture phase of a scan mode of operation of the integrated circuit but is otherwise in the first state, in which the output functional path associated with the primary output is tested, in the scan mode of operation.

4. The integrated circuit of claim 1 wherein the control circuitry is further configured to interrupt a clock signal applied to one or more flip-flops of the additional circuitry when testing the output functional path associated with the primary input.

5. The integrated circuit of claim 4 wherein the control circuitry comprises multiplexing circuitry configured to interrupt the clock signal by selecting between the clock signal and a predetermined value for application to clock inputs of said one or more flip-flops of the additional circuitry responsive to a control signal.

6. The integrated circuit of claim 1 wherein the control circuitry is further configured to hold at least one of a set input and a reset input of each of one or more flip-flops of the additional circuitry at particular designated values when testing the output functional path associated with the primary input.

7. The integrated circuit of claim 6 wherein the control circuitry comprises:
   a first latch circuit arranged in a set signal line of a given one of the flip-flops; and
   a second latch circuit arranged in a reset signal line of the given flip-flop;
   a given one of the latch circuits comprising a first inverter arranged in series with the set or reset signal line and a second inverter coupled back-to-back and in parallel with the first inverter, the second inverter being a tri-state inverter having a control input adapted to receive a control signal.

8. The integrated circuit of claim 1 wherein the control circuitry is further configured to prevent contention on the primary output when testing the output functional path associated with the primary output.

9. The integrated circuit of claim 1 wherein the control circuitry is at least partially incorporated within the scan test circuitry.

10. A processing device comprising the integrated circuit of claim 1.

11. The integrated circuit of claim 1 wherein the additional circuitry comprises:
    a first logic block receiving an input signal over the input functional path associated with the given one of the primary input and the primary output; and
    a second logic block sending an output signal over the output functional path associated with the given one of the primary input and the primary output.

12. An integrated circuit comprising:
    scan test circuitry comprising at least one scan chain having a plurality of scan cells;
    additional circuitry subject to testing utilizing the scan test circuitry; and
    control circuitry associated with the scan test circuitry and coupled to at least a given one of a primary input of the integrated circuit and a primary output of the integrated circuit;
    wherein the scan test circuitry is configurable by the control circuitry so as to permit testing of both an input functional path associated with the given one of the primary input and the primary output and an output functional path associated with the given one of the primary input and the primary output;

wherein the control circuitry comprises:
   multiplexing circuitry; and
   output enable circuitry associated with the given one of the primary input and the primary output; and
wherein the multiplexing circuitry controls the output enable circuitry between a first state establishing an input functional path for the given one of the primary input and the primary output and a second state establishing an output functional path for the given one of the primary input and the primary output.

13. The integrated circuit of claim 12 wherein the output enable circuitry is implemented in corresponding input-output circuitry comprising at least one bidirectional signal pad of the integrated circuit.

14. The integrated circuit of claim 13 wherein the bidirectional signal pad of the input-output circuitry is part of the input functional path in the first state and is part of the output functional path in the second state.

15. The integrated circuit of claim 12 wherein the control circuitry further comprises test control logic having a plurality of inputs coupled to respective primary inputs of the integrated circuit and an additional input adapted to receive a control signal for controlling at least a portion of the multiplexing circuitry.

16. The integrated circuit of claim 12 wherein the multiplexing circuitry comprises a two-to-one multiplexer having a first input adapted to receive an output enable signal, a second input adapted to receive a complemented version of the output enable signal, and a select signal input adapted to receive a select signal.

17. An integrated circuit comprising:
scan test circuitry comprising at least one scan chain having a plurality of scan cells;
additional circuitry subject to testing utilizing the scan test circuitry; and
control circuitry associated with the scan test circuitry and coupled to at least a given one of a primary input of the integrated circuit and a primary output of the integrated circuit;
wherein the scan test circuitry is configurable by the control circuitry so as to permit testing of both an input functional path associated with the given one of the primary input and the primary output and an output functional path associated with the given one of the primary input and the primary output;
wherein the additional circuitry comprises:
   a first logic block receiving an input signal over the input functional path associated with the given one of the primary input and the primary output; and
   a second logic block sending an output signal over the output functional path associated with the given one of the primary input and the primary output.

18. A method comprising:
configuring scan test circuitry of an integrated circuit to test an input functional path associated with a given one of a primary input and a primary output of the integrated circuit; and
configuring the scan test circuitry to test an output functional path associated with the given one of the primary input and the primary output;
wherein one of:
(i) the given one of the primary input and the primary output is the primary input and further wherein configuring the scan test circuitry comprises configuring the scan test circuitry in a first state in which the input functional path associated with the primary input is tested and configuring the scan test circuitry in a second state in which the output functional path associated with the primary input is tested; and
(ii) the given one of the primary input and the primary output is the primary output and further wherein configuring the scan test circuitry comprises configuring the scan test circuitry in a first state in which the output functional path associated with the primary output is tested and configuring the scan test circuitry in a second state in which the input functional path associated with the primary output is tested.

19. The method of claim 18 wherein the given one of the primary input and the primary output is the primary input, and the scan test circuitry is configured in the second state, in which the output functional path associated with the primary input is tested, in part of a capture phase of a scan mode of operation of the integrated circuit but is otherwise in the first state, in which the input functional path associated with the primary input is tested, in the scan mode of operation.

20. The method of claim 18 wherein the given one of the primary input and the primary output is the primary output, and the scan test circuitry is configured in the second state, in which the input functional path associated with the primary output is tested, in part of a capture phase of a scan mode of operation of the integrated circuit but is otherwise in the first state, in which the output functional path associated with the primary output is tested, in the scan mode of operation.

21. The method of claim 18 further comprising:
receiving an input signal over the input functional path associated with the given one of the primary input and the primary output; and
sending an output signal over the output functional path associated with the given one of the primary input and the primary output.

22. A non-transitory computer-readable storage medium having computer program code embodied therein for use in scan testing an integrated circuit, wherein the computer program code when executed in a testing system causes the testing system to perform the method of claim 18.

23. A processing system comprising:
a processor; and
a memory coupled to the processor and configured to store information characterizing an integrated circuit design;
wherein the processing system is configured to provide scan test circuitry and associated control circuitry within the integrated circuit design, the scan test circuitry comprising at least one scan chain having a plurality of scan cells, the control circuitry being coupled to at least a given one of a primary input of the integrated circuit and a primary output of the integrated circuit;
wherein the scan test circuitry is configurable by the control circuitry so as to permit testing of both an input functional path associated with the given one of the primary input and the primary output and an output functional path associated with the given one of the primary input and the primary output;
wherein one of:
(i) the given one of the primary input and the primary output is the primary input, wherein the scan test circuitry is configurable by the control circuitry in a first state in which the input functional path associated with the primary input is tested and in a second state in which the output functional path associated with the primary input is tested; and
(ii) the given one of the primary input and the primary output is the primary output, wherein the scan test circuitry is configurable by the control circuitry in a first state in which the output functional path associated with the primary output is tested and in a second state in which the input functional path associated with the primary output is tested.

24. The processing system of claim 23 wherein the given one of the primary input and the primary output is the primary input, and the scan test circuitry is configured in the second state, in which the output functional path associated with the primary input is tested, in part of a capture phase of a scan mode of operation of the integrated circuit but is otherwise in the first state, in which the input functional path associated with the primary input is tested, in the scan mode of operation.

25. The processing system of claim 23 wherein the given one of the primary input and the primary output is the primary output, and the scan test circuitry is configured in the second state, in which the input functional path associated with the primary output is tested, in part of a capture phase of a scan mode of operation of the integrated circuit but is otherwise in the first state, in which the output functional path associated with the primary output is tested, in the scan mode of operation.

* * * * *